(12) United States Patent
Haiberger

(10) Patent No.: US 10,020,433 B2
(45) Date of Patent: Jul. 10, 2018

(54) OPTOELECTRONIC COMPONENT

(71) Applicant: OSRAM Opto Semiconductors GmbH, Regensburg (DE)

(72) Inventor: Luca Haiberger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/308,648

(22) PCT Filed: May 7, 2015

(86) PCT No.: PCT/EP2015/060089
§ 371 (c)(1),
(2) Date: Nov. 3, 2016

(87) PCT Pub. No.: WO2015/173118
PCT Pub. Date: Nov. 19, 2015

(65) Prior Publication Data
US 2017/0148959 A1   May 25, 2017

(30) Foreign Application Priority Data

May 15, 2014 (DE) .................. 10 2014 106 882

(51) Int. Cl.
*H01L 33/00* (2010.01)
*H01L 33/56* (2010.01)
(Continued)

(52) U.S. Cl.
CPC ............ *H01L 33/56* (2013.01); *H01L 33/486* (2013.01); *H01L 33/502* (2013.01); *H01L 33/60* (2013.01);
(Continued)

(58) Field of Classification Search
USPC ......... 257/81, 82, 91, 98, 99, 100, 116, 117, 257/432–437, 749, E33.056–E33.059,
(Continued)

(56) References Cited

U.S. PATENT DOCUMENTS 6,774,405 B2   8/2004  Yasukawa et al.
2002/0134988 A1*  9/2002  Ishinaga ............... F21V 7/0091
                                                              257/99
(Continued)

FOREIGN PATENT DOCUMENTS

DE   10 2012 102 119 A1   9/2013
DE   10 2012 109 131 A1   3/2014
JP       2006-147851 A     6/2006
JP       2011-023621 A     2/2011

OTHER PUBLICATIONS

Epotek "Understanding Opitcal Properties for Epoxy Applications" 2012.*
Wikepedia "List of refractive Indices" 2017.*

*Primary Examiner* — Tram H Nguyen
(74) *Attorney, Agent, or Firm* — DLA Piper LLP (US)

(57) ABSTRACT

An optoelectronic component includes a housing, wherein a cavity is formed on an upper side of the housing, which is delimited by a wall, the housing has an empty space, the wall is arranged between the cavity and the empty space, the housing has a surface, the empty space is arranged between the surface of the housing and the wall, the wall and the surface are arranged at least partially parallel to each other, the wall includes an optically transparent material, and the wall has a wall thickness of 1 µm to 100 µm.

14 Claims, 2 Drawing Sheets

(51) Int. Cl.
  *H01L 33/48* (2010.01)
  *H01L 33/60* (2010.01)
  *H01L 33/62* (2010.01)
  *H01L 33/50* (2010.01)

(52) U.S. Cl.
  CPC ...... *H01L 33/62* (2013.01); *H01L 2933/0091* (2013.01)

(58) Field of Classification Search
  USPC .............. 257/E25.032, 13, 40, 79–103, 918, 257/E51.018–E51.022, 458, 656, 257/E33.046, E29.336, E31.036, 257/E31.087–E31.088; 438/25–28, 438/22–47, 69, 493, 503, 507, 956
  See application file for complete search history.

(56) References Cited

U.S. PATENT DOCUMENTS

| | | | |
|---|---|---|---|
| 2009/0218584 A1* | 9/2009 | Bogner | H01L 31/0203 257/98 |
| 2009/0322197 A1* | 12/2009 | Helbing | H01L 33/507 313/46 |
| 2012/0273811 A1* | 11/2012 | Krauter | H01L 31/0203 257/88 |
| 2013/0235577 A1 | 9/2013 | Park et al. | |
| 2014/0312371 A1* | 10/2014 | Wong | F21V 33/0004 257/98 |
| 2015/0129914 A1* | 5/2015 | Tien | H01L 33/486 257/98 |

* cited by examiner

OPTOELECTRONIC COMPONENT

TECHNICAL FIELD

This disclosure relates to an optoelectronic component.

BACKGROUND

Optoelectronic components, for example, light-emitting diode components having a housing with embedded leadframe sections, are known. Such housings have a cavity in which an optoelectronic semiconductor chip is arranged and electrically conductively connects to the leadframe sections. The walls of the cavity act as a reflector to concentrate electromagnetic radiation emitted by the optoelectronic semiconductor chip and are for this purpose generally formed from a material with good optical reflective properties. However, for example, under the influence of high-energy radiation, the housing materials of such optoelectronic components are subject to aging, which may result in discoloration. As a result, the reflective properties of the wall of the cavity may change disadvantageously. Finally, the aging of the housing material limits the service life of such optoelectronic components.

SUMMARY

I provide an optoelectronic component including a housing, wherein a cavity is formed on an upper side of the housing, which is delimited by a wall, the housing has an empty space, the wall is arranged between the cavity and the empty space, the housing has a surface, the empty space is arranged between the surface of the housing and the wall, the wall and the surface are arranged at least partially parallel to each other, the wall includes an optically transparent material, and the wall has a thickness of 1 µm to 100 µm.

LIST OF REFERENCE NUMERALS

Figure 1:
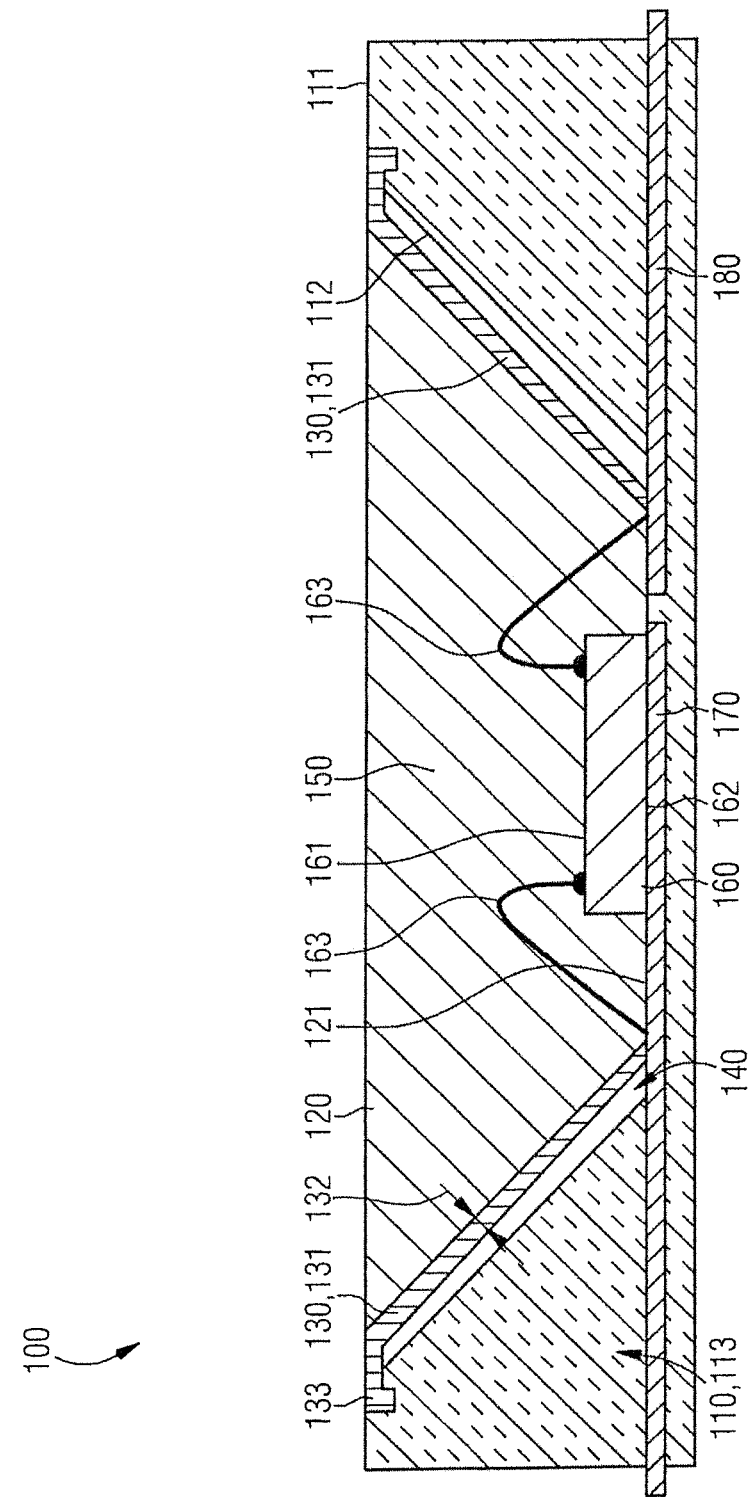
FIG. 1 schematically shows a first optoelectronic component.

100 First optoelectronic component
110 Housing
111 Upper side
112 Surface
113 Housing material
120 Cavity
121 Base
130 Wall
131 Wall material
132 Wall thickness
133 Anchor
140 Empty space
150 Potting material
160 Optoelectronic semiconductor chip
161 Upper side
162 Lower side
163 Bonding wire
170 First leadframe section
180 Second leadframe section
200 Second optoelectronic component
210 Housing
211 Upper side
212 Surface
213 Housing material
220 Cavity
221 Base
230 Wall
240 Empty space
250 Potting material
260 Optoelectronic semiconductor chip
261 Upper side
262 Lower side
263 Bonding wire
270 First leadframe section
280 Second leadframe section

DETAILED DESCRIPTION

My optoelectronic component includes a housing, on whose upper side a cavity is formed which is delimited by a wall. The housing has an empty space. The wall is arranged between the cavity and the empty space. The wall includes an optically transparent material.

In this optoelectronic component, electromagnetic radiation generated in the region of the cavity, for example, visible light, may penetrate the optically transparent material of the wall delimiting the cavity. A marked change in the optical index of refraction occurs at the interface between the material of the wall and the empty space adjacent to the wall. As a result, an internal reflection may occur at the interface between the optically transparent material of the wall and the empty space. Electromagnetic radiation reaching the optically transparent material of the wall from the cavity is thus reflected back into the cavity of the optoelectronic component at the interface between the material of the wall and the empty space, and may thereby be radiated by the optoelectronic component in a useful direction.

Thus, the reflective properties of the interface between the optically transparent material of the wall and the empty space of the housing of the optoelectronic component are advantageously essentially not subject to aging. As a result, by the optoelectronic component, it is advantageously possible to achieve a consistently high proportion of electromagnetic radiation radiated in a useful direction in space. Due to the essentially invariable reflective properties of the interface between the optically transparent material of the wall and the empty space, a color impression of electromagnetic radiation radiated by the optoelectronic component advantageously also does not essentially change over the service life of the optoelectronic component.

A potting material may be arranged in the cavity. The potting material may be used to protect components of the optoelectronic component from damage through external influences. The potting material may also act as a matrix for wavelength-converting particles embedded in the potting material and/or scattering particles embedded in the potting material. In addition, the potting material may be used to reduce a change in an optical index of refraction at the interface between the cavity and the optically transparent material of the wall, as a result of which only minor reflection occurs at the interface between the potting material and the material of the wall.

The potting material may have an optical index of refraction different from an optical index of refraction of the material of the wall by less than 20%. Preferably, the optical index of refraction of the potting material differs from the optical index of refraction of the material of the wall by even less than 10%, particularly preferably by less than 5%. Advantageously, only minor reflection of electromagnetic radiation generated in the cavity of the optoelectronic component then occurs at the interface between the potting material and the material of the wall.

The potting material may include a silicone. Advantageously, this makes it possible to introduce the potting material into the cavity of the housing of the optoelectronic component in a simple and economical manner. In addition, a potting material including a silicone has advantageous mechanical properties and is highly resistant to aging.

The material of the wall may include a silicone, PMMA, or a polycarbonate. Advantageously, these materials allow forming the wall with high optical transparency, whereby absorption losses in the wall are advantageously kept low.

A gas, preferably air, may be disposed in the empty space. Advantageously, an optical index of refraction of the gas disposed in the empty space then differs markedly from the optical index of refraction of the optically transparent material of the wall, resulting in a strong reflection at the interface between the material of the wall and the empty space.

The housing may have a surface. In this case, the empty space is arranged between the surface of the housing and the wall. Advantageously, this makes it possible to manufacture the optoelectronic component in a simple manner, in which the empty space is formed by arranging the wall above the surface of the housing. An additional advantage of this arrangement is that electromagnetic radiation having penetrated the optically transparent material of the wall delimiting the cavity from the cavity of the housing of the optoelectronic component, and was not reflected at the interface between the material of the wall and the empty space, may be reflected at the surface of the housing, and may in this way be guided in a radiation direction of the optoelectronic component.

The wall and the surface may be arranged at least partially parallel to each other. Advantageously, it is thus achieved that electromagnetic radiation having reached the empty space from the cavity through the optically transparent material of the wall adjacent to the cavity, without reflection at the interface between the wall and the empty space, meets the surface of the housing at an angle which is advantageous for reflection at the surface of the housing, and is thereby reflected with a high degree of probability in a radiation direction of the optoelectronic component at the surface of the housing.

The wall may have a wall thickness of 1 µm to 100 µm. Advantageously, such a low wall thickness of the wall produces only low absorption losses within the wall of the optoelectronic component adjacent to the cavity.

The housing may include an optically reflective material. Advantageously, as a result, electromagnetic radiation having reached the optically transparent material of the wall adjacent to the cavity from the cavity of the housing of the optoelectronic component, and having reached the empty space at the interface between the material of the wall and the empty space without reflection, may be reflected with a high degree of reflectance at the surface of the housing.

The wall may be anchored to the housing on the upper side of the housing. Advantageously, a mechanically stable design of the housing of the optoelectronic component is thereby obtained.

The housing and the wall may be integrally connected. Advantageously, as a result, the housing of the optoelectronic component may be manufactured in a particularly simple and economical manner.

An optoelectronic semiconductor chip may be arranged in the cavity. In this case, the optoelectronic semiconductor chip may be designed to emit electromagnetic radiation. For example, the optoelectronic semiconductor chip may be a light-emitting diode (LED) chip.

A first leadframe section and a second leadframe section may be embedded in the housing. In this case, portions of the first leadframe section and portions of the second leadframe section at the base of the cavity are not covered by the material of the housing. The leadframe sections embedded in the housing may be used to provide electrical contacts of the optoelectronic component which are externally accessible. An optoelectronic semiconductor chip arranged in the cavity of the optoelectronic component may electrically conductively connect to the exposed portions of the leadframe sections at the base of the cavity.

The empty space may be adjacent to the first leadframe section and/or the second leadframe section. Advantageously, a particularly simple geometry of the housing of the optoelectronic component is thereby obtained.

The above-described properties, features and advantages and the way in which they are achieved will become clearer and more clearly understood in association with the following description of the examples explained in greater detail in association with the drawings.

FIG. 1 shows a schematic cut-away side view of a first optoelectronic component 100. The first optoelectronic component 100 is designed to emit electromagnetic radiation, for example, visible light. The first optoelectronic component 100 may, for example, be a light-emitting diode component (LED component).

The first optoelectronic component 100 has a housing 110. The housing 110 may be referred to as a package.

The housing 110 includes a housing material 113. The housing material 113 is an electrically insulating material, preferably a plastic material. The housing material 113 may, for example, include an epoxy resin or a silicone.

Preferably, the housing material 113 of the housing 110 has good optical reflective properties, i.e., high optical reflectivity. The housing material 113 of the housing 110 may, for example, have a white color.

The housing 110 of the first optoelectronic component 100 may, for example, be manufactured via a molding process, in particular via transfer molding or via injection molding. The housing 110 may be manufactured together with a plurality of similar housings 110 in an integrally connected housing composite structure, and may be separated by dividing the housing composite structure, only after carrying out further processing steps performed jointly for all housings 110.

The first optoelectronic component 100 has a first leadframe section 170 and a second leadframe section 180. The first leadframe section 170 and the second leadframe section 180 are at least partially embedded in the housing material 113 of the housing 110 of the first optoelectronic component 100. The first leadframe section 170 and the second leadframe section 180 each include an electrically conductive material, preferably a metal. The first leadframe section 170 and the second leadframe section 180 are each essentially flat sections of a metal sheet and arranged laterally next to each other in a common plane. The first leadframe section 170 and the second leadframe section 180 are spaced apart from each other and electrically insulated from each other.

Preferably, the first leadframe section 170 and the second leadframe section 180 are already embedded in the housing material 113 of the housing 110 during the manufacture of the housing 110. In this case, the first leadframe section 170 and the second leadframe section 180 may be formed from sections of a connected leadframe. If the housing 110 is formed in a housing composite structure together with a plurality of similar housings 110, the leadframe may then include a plurality of first leadframe sections 170 and second leadframe sections 180 and may be embedded in the housing composite structure. In this case, the leadframe is divided together with the housing composite structure during the separation of the housing 110 of the first optoelectronic component 100.

A cavity 120 is formed on an upper side 111 of the housing 110 of the first optoelectronic component 100. The cavity 120 extends from the upper side 111 into the housing 110. In doing so, the cavity 120 in the depicted example expands conically toward the upper side 111 of the housing 110. However, it is possible to form the cavity 120 having another geometry, for example, having a cylindrical geometry.

Portions of the first leadframe section 170 and portions of the second leadframe section 180 are not covered by the housing material 113 of the housing 110 at a base 121 of the cavity 120.

The cavity 120 is laterally delimited via a circumferential wall 130. The wall 130 is arranged in a recess of the housing 110 and extends from the base 121 of the cavity 120 to the opening of the cavity 120 on the upper side 111 of the housing 110. In the example depicted in FIG. 1 of the cavity 120 expanding from the base 121 toward its external opening, the wall 130 essentially has the shape of a conical circumferential surface.

In the recess of the housing 110, the wall 130 is spaced apart from a surface 112 of the housing 110 facing the wall 130 such that an empty space 140 is arranged between the wall 130 and the surface 112 of the housing 110. The empty space 140 is adjacent to the first leadframe section 170 and the second leadframe section 180. For example, air or another gas may be disposed in the empty space 140.

The wall 130 is preferably essentially oriented parallel to the surface 112 of the housing 110 facing the wall 130. Thus, the empty space 140 between the wall 130 and the surface 112 of the housing 110 also essentially has the shape of a conical circumferential surface.

The wall 130 has a wall thickness 132. The wall thickness 132 may, for example, be 1 µm to 100 µm.

On the upper side 111 of the housing 110, the wall 130 connects to the remaining sections of the housing 110 by an anchor 133.

The wall 130 includes a wall material 131. The wall material 131 is an optically transparent material. The wall material 131 may, for example, include a silicone, a polycarbonate, or PMMA.

The wall 130 may, for example, be manufactured via a molding process, for example, via transfer molding or via injection molding. Preferably, the wall 130 is manufactured separately from the remaining sections of the housing 110 and is only subsequently arranged in the recess of the housing 110 and connected to the remaining sections of the housing 110 by the anchor 133.

An optoelectronic semiconductor chip 160 is arranged in the cavity 120 of the housing 110. The optoelectronic semiconductor chip 160 is designed to emit electromagnetic radiation, for example, visible light. The optoelectronic semiconductor chip 160 may, for example, be a light-emitting diode chip (LED chip).

The optoelectronic semiconductor chip 160 has an upper side 161 and a lower side 162 opposite the upper side 161. The optoelectronic semiconductor chip 160 is arranged on the base 121 of the cavity 120, on the portion of the first leadframe section 170 not covered by the housing material 113 of the housing 110 such that the lower side 162 of the optoelectronic semiconductor chip 160 faces the first leadframe section 170 and connects to the first leadframe section 170. For example, the optoelectronic semiconductor chip 160 may connect to the first leadframe section 170 by a solder, an adhesive, or another chip bond connection.

Electrical contact pads of the optoelectronic semiconductor chip 160 are formed on the upper side 161 of the optoelectronic semiconductor chip 160. A first electrical contact pad of the optoelectronic semiconductor chip 160 electrically conductively connects to the portion of the first leadframe section 170 not covered by the housing material 113 by a bonding wire 163. A second electrical contact pad of the optoelectronic semiconductor chip 160 electrically conductively connects to the portion of the second leadframe section 180 not covered by the housing material 113 by an additional bonding wire 163. This makes it possible to supply the optoelectronic semiconductor chip 160 with a voltage via the first leadframe section 170 and the second leadframe section 180, to induce the optoelectronic semiconductor chip 160 to emit electromagnetic radiation. For this purpose, the first leadframe section 170 and the second leadframe section 180 may form accessible electrical connections of the first optoelectronic component 100 from outside the first optoelectronic component 100.

A potting material 150 is arranged in the cavity 120 of the housing 110 of the first optoelectronic component 100. The optoelectronic semiconductor chip 160 and the bonding wires 163 are embedded in the potting material 150. As a result, the potting material 150 may be used to protect the optoelectronic semiconductor chip 160 and the bonding wires 163 from damage due to external influences.

After arranging the optoelectronic semiconductor chip 160 at the base 121 of the cavity 120 and after manufacturing the electrically conductive connections between the optoelectronic semiconductor chip 160 and the leadframe sections 170, 180, the potting material 150 may be arranged in the cavity 120 of the housing 110 of the first optoelectronic component 100 by the bonding wires 163. For example, the potting material 150 may be introduced into the cavity 120 via a metering process or molding process, for example, via compression molding.

The potting material 150 includes an optically essentially transparent material. For example, the potting material 150 may include a silicone. The potting material 150 may additionally include embedded wavelength-converting particles and/or embedded scattering particles. Wavelength-converting particles embedded in the potting material 150 may be used to convert a wavelength of electromagnetic radiation emitted by the optoelectronic semiconductor chip 160. Scattering particles embedded in the potting material 150 may be used to scatter electromagnetic radiation emitted by the optoelectronic semiconductor chip 160 to achieve a homogeneous and/or isotropic light distribution.

The potting material 150 has an optical index of refraction corresponding as closely as possible to an optical index of refraction of the wall material 131 of the wall 130. Preferably, the optical index of refraction of the potting material 150 and the optical index of refraction of the wall material 131 of the wall 130 differ by less than 20%, particularly preferably by less than 10%, in particular preferably by less than 5%.

The optical index of refraction of the wall material 131 of the wall 130 and an optical index of refraction of the empty space 140, for example, an optical index of refraction of a gas disposed in the empty space 140, differ significantly from each other.

Electromagnetic radiation radiated by the optoelectronic semiconductor chip 160 in the direction of the wall 130 may penetrate the optically transparent wall material 131 of the wall 130. The optical index of refraction changes markedly at the interface between the wall material 131 of the wall 130 and the empty space 140. As a result, a high proportion of the electromagnetic radiation entering the wall material 131 of the wall 130 from the cavity 120 may be reflected at the interface between the wall material 131 and the empty space 140. Due to the large differences between the index of refraction of the wall material 131 and the empty space 140, in particular a critical angle of the total reflection at the interface between the wall material 131 and the empty space 140 may have a small value so that a high proportion of the electromagnetic radiation entering the wall material 131 of the wall 130 from the cavity 120 is totally reflected at the interface between the wall material 131 and the empty space 140. Electromagnetic radiation reflected at the interface between the wall 130 and the empty space 140 returns into the cavity 120 of the housing 110 and may be reflected in the forward direction of the first optoelectronic component 100 and thereby put to use.

Electromagnetic radiation entering the wall material 131 of the wall 130 from the cavity 120, and not reflected at the interface between the wall 130 and the empty space 140, reaches the empty space 140. Such electromagnetic radiation may be reflected at the surface 112 of the housing 110 facing the wall 130, and may return along this path into the cavity 120, and may be radiated in the forward direction of the first optoelectronic component 100. For this purpose, the housing material 113 of the housing 110 preferably has good optical reflective properties so that a high proportion of electromagnetic radiation reaching the surface 112 of the housing 110 is reflected at the surface 112 of the housing 110. However, the overall proportion of electromagnetic radiation reaching the surface 112 of the housing 110 due to the reflection at the interface between the wall 130 and the empty space 140 is low. As a result, only minor aging and discoloration of the surface 112 of the housing 110 result, even after a long service life of the first optoelectronic component 100.

Figure 2:
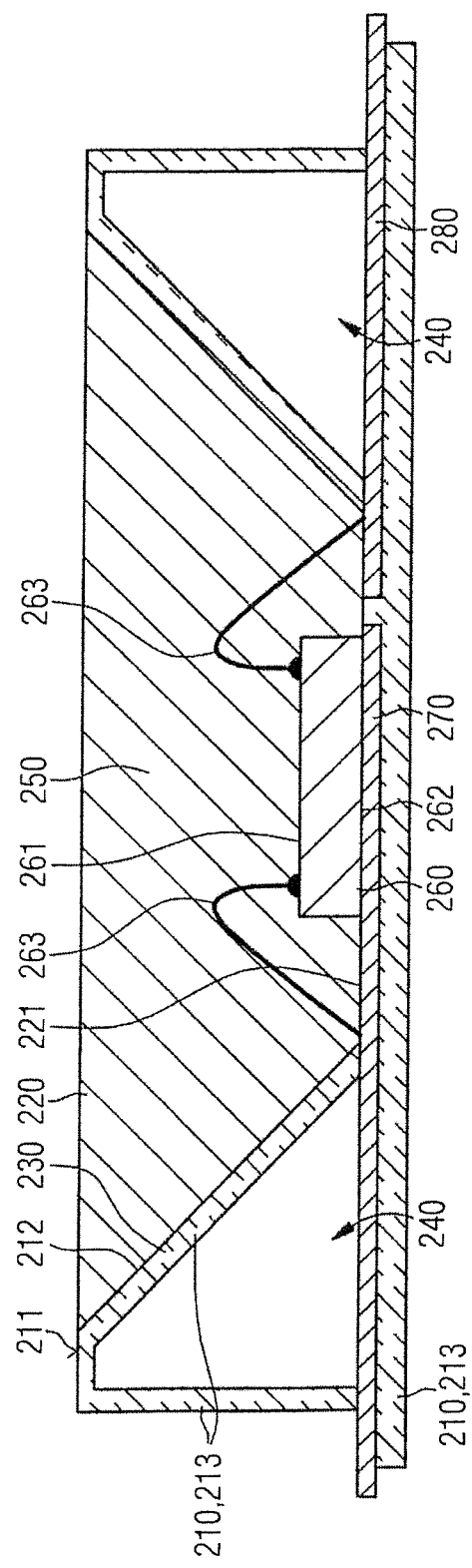
FIG. 2 schematically shows a second optoelectronic component.

FIG. 2 shows a schematic cut-away side view of a second optoelectronic component 200. The second optoelectronic component 200 has similarities to the first optoelectronic component 100 of FIG. 1. The description above of the first optoelectronic component 100 and the description below of the second optoelectronic component 200 therefore also apply to the other optoelectronic component 100, 200 in each case, if differences are not explicitly mentioned.

The second optoelectronic component 200 is designed to emit electromagnetic radiation, for example, visible light, and may, for example, be a light-emitting diode component (LED component). For this purpose, the second optoelectronic component 200 includes an optoelectronic semiconductor chip 260 which, for example, may be a light-emitting diode chip (LED chip). The optoelectronic semiconductor chip 260 has an upper side 261 and a lower side 262 opposite the upper side.

The second optoelectronic component 200 has a housing 210. The housing 210 includes an electrically insulating housing material 213, preferably a plastic material. The housing material 213 is optically transparent. The housing material 213 may, for example, include a silicone, a polycarbonate, or PMMA.

The housing 210 of the second optoelectronic component 200 may be manufactured via a molding process, for example, via transfer molding or via injection molding. The housing 210 may be manufactured together with a plurality of similar housings 210 in a connected housing composite structure, and may be separated by dividing the housing composite structure, only after completing further processing steps carried out jointly for all housings 210 of the housing composite structure.

A first leadframe section 270 and a second leadframe section 280 are embedded in the housing material 213 of the housing 210. The first leadframe section 270 and the second leadframe section 280 each include an electrically conductive material, preferably a metal. The first leadframe section 270 and the second leadframe section 280 are essentially flat and two-dimensional sections of a metal sheet and are arranged laterally next to each other in a common plane. In this case, the first leadframe section 270 and the second leadframe section 280 are spaced apart from each other and electrically insulated from each other.

The first leadframe section 270 and the second leadframe section 280 are preferably already embedded in the housing material 213 of the housing 210 during the manufacture of the housing 210 of the second optoelectronic component 200. In this case, the first leadframe section 270 and the second leadframe section 280 may be formed via sections of a common leadframe. If the housing 210 is manufactured jointly with a plurality of similar housings 210 in a connected housing composite structure, a leadframe may be embedded in the housing composite structure comprising a plurality of first leadframe sections 270 and second leadframe sections 280. In this case, the leadframe is divided together with the housing composite structure when separating the housing 210 of the second optoelectronic component 200.

A cavity 220 is formed on an upper side 211 of the housing 210 of the second opto-electronic component 200. The cavity 220 extends into the housing 210 from the upper side 211 of the housing 210 to a base 221 of the cavity 220. In doing so, the cavity 220 expands conically from the base 221 of the cavity 220 toward the upper side 211 of the housing 210. However, it is also possible to form the cavity 220 having another geometry, for example, cylindrical.

The cavity 220 of the housing 210 of the second optoelectronic component 200 is laterally delimited by a wall 230. The wall 230 is formed via a section of the housing 210 and includes the housing material 213. A surface 212 of the wall 230 faces the cavity 220.

Portions of the first leadframe section 270 and portions of the second leadframe section 280 are not covered by the housing material 213 of the housing 210 at the base 221 of the cavity 220. The optoelectronic semiconductor chip 260 is arranged in the cavity 220 at the base 221 of the cavity 220 on the portion of the first leadframe section 270 not covered by the housing material 213. In this case, the lower side 262 of the optoelectronic semiconductor chip 260 faces the first leadframe section 270 and connects to the first leadframe section 270 via a chip bond connection, for example, a solder connection or an adhesive connection. A first electrical contact pad of the optoelectronic semiconductor chip 260 arranged on the upper side 261 of the optoelectronic semiconductor chip 260 electrically conductively connects to the first leadframe section 270 via a bonding wire 263. A second electrical contact pad of the optoelectronic semiconductor chip 260 arranged on the upper side 261 of the optoelectronic semiconductor chip 260 electrically conductively connects to the second leadframe section 280 via an additional bonding wire 263.

A potting material 250 is arranged in the cavity 220 of the housing 210 of the second optoelectronic component 200. The optoelectronic semiconductor chip 260 and the bonding wires 263 are embedded in the potting material 250. The potting material includes a material essentially transparent to electromagnetic radiation emitted by the optoelectronic semiconductor chip 260. The potting material 250 may, for example, include a silicone. In addition, the potting material 250 may include embedded wavelength-converting particles and/or embedded scattering particles.

The housing 210 of the second optoelectronic component 200 has an empty space 240. No housing material 213 is arranged in the empty space 240. Instead, a gas may be disposed in the empty space 240, for example, air.

The empty space 240 is separated from the cavity 220 by the wall 230. The wall 230 is thus arranged between the cavity 220 and the empty space 240. The wall 230 may, for example, have a wall thickness of 1 μm to 100 μm. In addition, the empty space 240 is adjacent to sections of the first leadframe section 270 and the second leadframe section 280 not covered by the housing material 213.

The potting material 250 arranged in the cavity 220 has an optical index of refraction which differs only slightly from an optical index of refraction of the housing material 213 of the wall 230. Preferably, the index of refraction of the potting material 250 and the index of refraction of the housing material 213 of the wall 230 differ by less than 20%, particularly preferably by less than 10%, in particular preferably by less than 5%.

However, the index of refraction of the housing material 213 of the wall 230 and an optical index of refraction of the gas disposed in the empty space 240 differ from each other significantly.

Electromagnetic radiation emitted by the optoelectronic semiconductor chip 260 in the direction of the wall 230 of the cavity 220 may penetrate the optically transparent housing material 213 of the wall 230. On the other hand, electromagnetic radiation penetrating the wall 230 at the interface between the wall 230 and the empty space 240 is reflected with a high degree of probability due to the marked change in the optical index of refraction. In particular, electromagnetic radiation at the interface between the wall 230 and the empty space 240 may be totally reflected. Electromagnetic radiation reflected at the interface between the wall 230 and the empty space 240 returns to the cavity 220 and may subsequently be radiated by the second optoelectronic component 200 as useful electromagnetic radiation in the forward direction.

My components are illustrated and described in greater detail based on the preferred examples. However, this disclosure is not limited to the described examples. Rather, other variations may be derived from them by those skilled in the art, without departing from the scope of protection of the appended claims.

This application claims priority of DE 10 2014 106 882.3, the subject matter of which is incorporated herein by reference.

The invention claimed is:

1. An optoelectronic component comprising:
a housing having a cavity formed on an upper side of the housing, which is delimited by a wall, wherein the housing has an empty space, the wall is arranged between the cavity and the empty space, and the wall includes an optically transparent material, and
a potting material arranged in the cavity such that an interface is formed between the potting material and a material of the wall, and having an optical index of refraction different from an optical index of refraction of the material of the wall by less than 20%.

2. The optoelectronic component as claimed in claim 1, wherein the potting material includes a silicone.

3. The optoelectronic component as claimed in claim 1, wherein the material of the wall includes a silicone, PMMA, or a polycarbonate.

4. The optoelectronic component as claimed in claim 1, wherein a gas is disposed in the empty space.

5. The optoelectronic component as claimed in claim 1, wherein the housing includes an optically reflective material.

6. The optoelectronic component as claimed in claim 1, wherein the wall is anchored to the housing, on the upper side of the housing.

7. The optoelectronic component as claimed in claim 1, wherein an optoelectronic semiconductor chip is arranged in the cavity.

8. The optoelectronic component as claimed in claim 1, wherein a first leadframe section and a second leadframe section are embedded in the housing,
portions of the first leadframe section and portions of the second leadframe section at the base of the cavity are not covered by the material of the housing.

9. The optoelectronic component as claimed in claim 8, wherein the empty space is adjacent to the first leadframe section and/or the second leadframe section.

10. The optoelectronic component as claimed in claim 1, wherein the housing has a surface, and the empty space is arranged between the surface and wall.

11. The optoelectronic component as claimed in claim 1, wherein the wall and the surface are arranged at least partially parallel to each other.

12. The optoelectronic component as claimed in claim 1, wherein the wall has a wall thickness of 1 μm to 100 μm.

13. The optoelectronic component as claimed in claim 1, wherein the optical index of refraction different from the optical index of refraction of the material of the wall is less than 10%.

14. The optoelectronic component as claimed in claim 1, wherein the optical index of refraction different from the optical index of refraction of the material of the wall is less than 5%.

* * * * *